United States Patent
Lo et al.

(10) Patent No.: US 7,452,750 B2
(45) Date of Patent: Nov. 18, 2008

(54) CAPACITOR ATTACHMENT METHOD

(75) Inventors: Wai Yew Lo, Selangor (MY); Chee Seng Foong, Selangor (MY)

(73) Assignee: Freescale Semiconductor, Inc, Austin, TX (US)

( * ) Notice: Subject to any disclaimer, the term of this patent is extended or adjusted under 35 U.S.C. 154(b) by 269 days.

(21) Appl. No.: 11/365,119

(22) Filed: Feb. 28, 2006

(65) Prior Publication Data

US 2007/0202632 A1    Aug. 30, 2007

(51) Int. Cl.
*H01L 21/00* (2006.01)

(52) U.S. Cl. .............................. 438/108; 257/E21.506; 257/E21.511; 257/E21.513

(58) Field of Classification Search ................. 257/724, 257/780, 781; 438/108
See application file for complete search history.

(56) References Cited

U.S. PATENT DOCUMENTS

| 5,210,683 | A | | 5/1993 | Ley |
| 5,684,677 | A | * | 11/1997 | Uchida et al. ............... 361/770 |
| 6,145,735 | A | | 11/2000 | Mallery et al. |
| 6,790,293 | B2 | | 9/2004 | Nomura et al. |
| 7,319,048 | B2 | * | 1/2008 | Lu et al. ..................... 438/106 |
| 2001/0040006 | A1 | * | 11/2001 | Pompeo et al. .......... 156/307.1 |
| 2002/0195170 | A1 | | 12/2002 | Normura et al. |

* cited by examiner

*Primary Examiner*—David A Zarneke
(74) *Attorney, Agent, or Firm*—Charles Bergere

(57) ABSTRACT

A method of attaching a capacitor (112) to a substrate (100) includes applying a flux (108) to respective capacitor pads (104, 106) on the substrate (100). The capacitor (112) is placed on the fluxed capacitor pads (104, 106) and a reflow operation is performed on the capacitor (112) and the substrate (100) such that intermetallic interconnects (128) are formed between the capacitor (112) and the substrate (100).

20 Claims, 5 Drawing Sheets

150

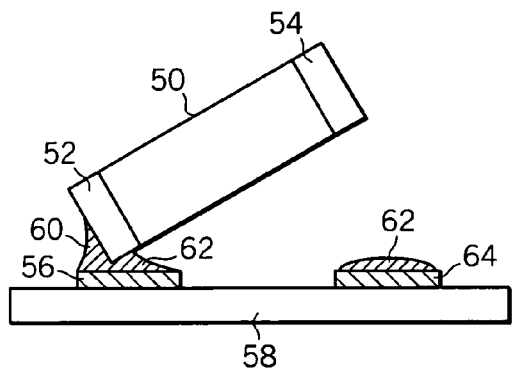
FIG. 3
-PRIOR ART-
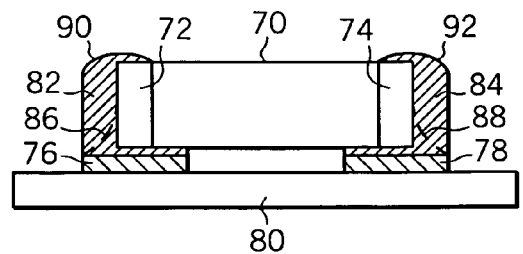
FIG. 4
-PRIOR ART-
FIG. 7
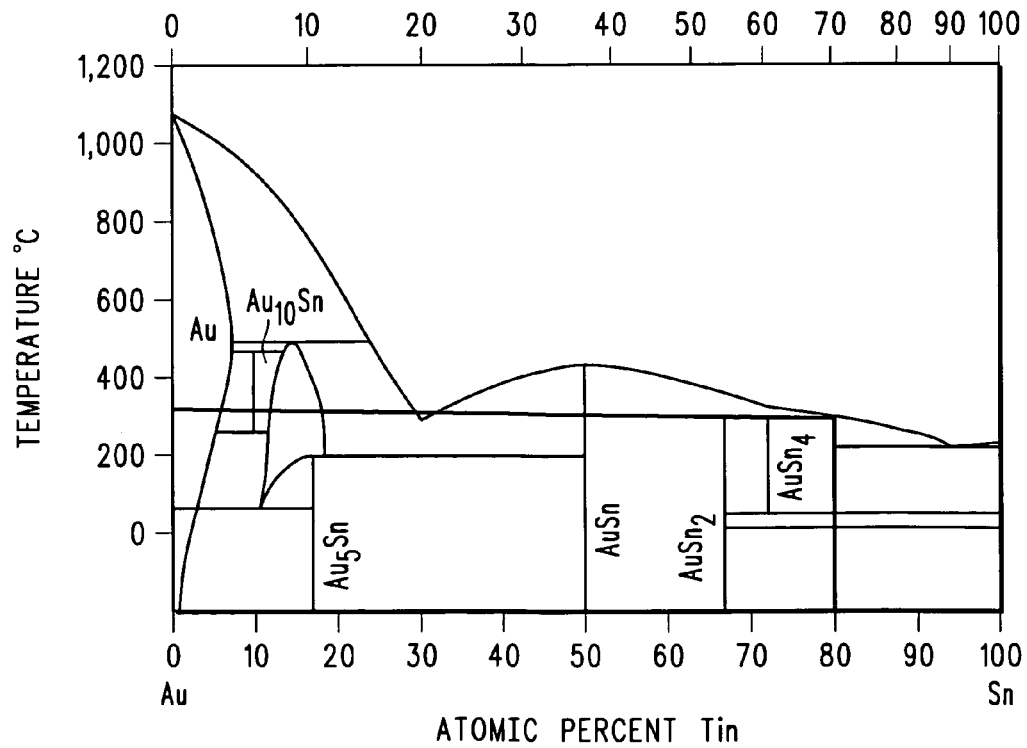

CAPACITOR ATTACHMENT METHOD

BACKGROUND OF THE INVENTION

The present invention relates to the packaging of integrated circuits (ICs) and more particularly to a method of attaching a capacitor to a substrate.

Solder paste, a specially blended paste of highly graded solder alloy powder particles in a flux medium, is commonly used for attaching a capacitor to a substrate. FIG. 1 illustrates a conventional method 10 of forming a semiconductor package including attaching a capacitor to a substrate. In a first step 12, solder paste is dispensed onto specific locations on a substrate and at step 14, a capacitor is attached to the substrate using the solder paste. A flux is dispensed onto controlled collapse chip connection (C4) pads on the substrate at step 16, and a bumped integrated circuit (IC) die is placed on the fluxed C4 pads at step 18. A reflow operation is performed at step 20. The reflow operation melts the solder paste, forming solder joints between the capacitor and the substrate. At step 22, an underfill is dispensed into gaps between the substrate and the bumped IC die, thereby forming the packaged semiconductor device.

However, a number of problems are encountered in current solder attachment processes used to mount capacitors onto substrate surfaces. These include solder balling, tombstoning and excess solder. Each of these problems is a cause for rejecting a semiconductor unit.

Solder balling is a soldering defect characterised by the presence of tiny solder balls trapped along a peripheral edge of the solder joint. An example of a solder balling defect is shown in FIG. 2. In FIG. 2, a capacitor 30 having a first end termination 32 and a second end termination 34 is shown. The first and second end terminations 32 and 34 of the capacitor 30 are respectively attached to a first capacitor pad 36 and a second capacitor pad 38 on a substrate 40 via respective first and second solder joints 42 and 44. As can be seen, a solder ball 46 is formed on a surface of the first solder joint 42. The presence of a number of such solder balls 46 often leads to capacitor shorting.

Tomb stoning is a phenomenon where one end of a component is lifted off a substrate, while the opposite end of the component remains bonded to the substrate. An example of a tombstoning defect is shown in FIG. 3. FIG. 3 shows a capacitor 50 having a first end termination 52 and a second end termination 54. The first end termination 52 of the capacitor 50 is bonded to a first capacitor pad 56 on a substrate 58 via a joint 60 formed of a solder material 62. As can be seen, the second end termination 54 of the capacitor 50 is raised and detached from a second capacitor pad 64 on the substrate 58. The tomb stoning defect shown in FIG. 3 may be caused by unequal volumes of solder material 62 deposited on the first and second capacitor pads 56 and 64.

Referring now to FIG. 4, an example of excess solder will now be described. FIG. 4 shows a capacitor 70 having a first end termination 72 and a second end termination 74. The first and second end terminations 72 and 74 of the capacitor 70 are respectively attached to a first capacitor pad 76 and a second capacitor pad 78 on a substrate 80 via respective first and second solder joints 82 and 84. However, instead of having desirable concave profiles 86 and 88 (defined by dashed lines in FIG. 4), the first and second solder joints 82 and 84 have convex profiles 90 and 92 (defined by solid lines in FIG. 4) due to the presence of excess solder. Excess solder is undesirable as too much solder can result in a bridging defect, which will cause an electrical short.

Besides losses from rejecting semiconductor units with solder attachment problems, material, labour and machine costs are also incurred when solder paste is used in the capacitor attachment process. All these add to the overall manufacturing cost.

In view of the foregoing, it would be desirable to have a method of attaching a capacitor to a substrate without using solder paste.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 3 is an enlarged cross-sectional view of a capacitor with one end lifted off a substrate and an opposite end bonded to the substrate;

FIG. 4 is an enlarged cross-sectional view of excess solder in respective solder joints between a capacitor and a substrate;

FIG. 7 is a phase diagram of a gold-tin (Au—Sn) system.

DETAILED DESCRIPTION OF THE INVENTION

Figure 1:
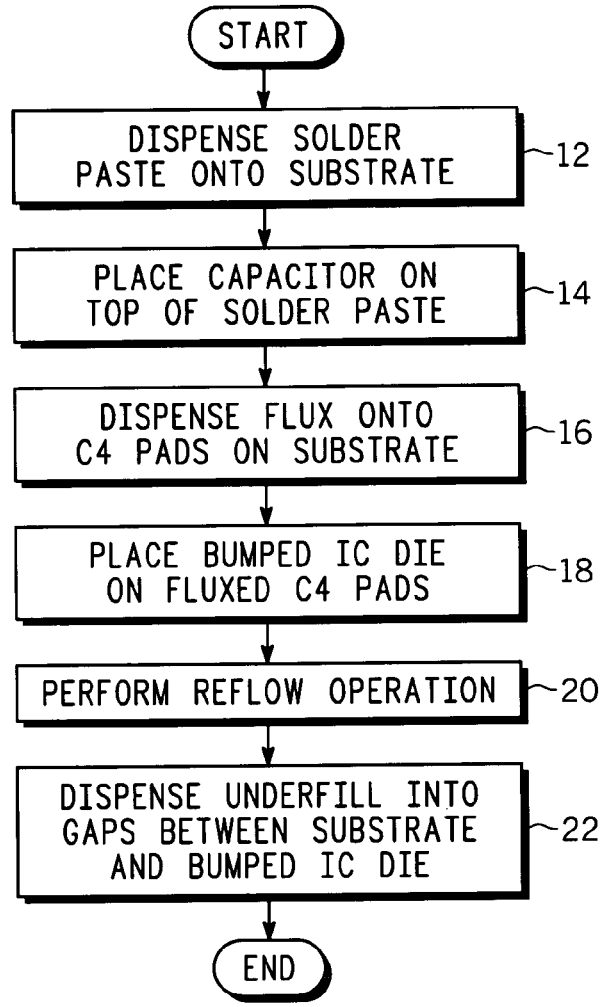
FIG. 1 is a flowchart depicting a conventional method of forming a packaged semiconductor device.
Figure 2:
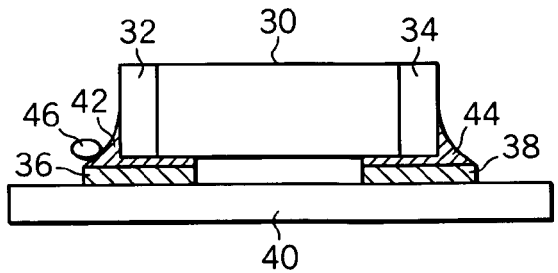
FIG. 2 is an enlarged cross-sectional view of a solder ball formed on a surface of a solder joint between a capacitor and a substrate.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a method of attaching a capacitor to a substrate. The method essentially includes only applying a flux to gold (Au) or gold plated capacitor pads on the substrate, placing the capacitor on the fluxed capacitor pads, and performing a reflow operation. The capacitor terminals preferably are tin (Sn) or tin plated.

The present invention also provides a method of forming a packaged semiconductor device, the major steps essentially including only providing a substrate, applying a flux to controlled collapse chip connection (C4) pads and respective gold or gold plated capacitor pads on the substrate, placing one or more capacitors on the respective capacitor pads and one or more integrated circuit (IC) dice on the C4 pads on the substrate, and performing a reflow operation on the capacitors, the IC dice and the substrate. Preferably the capacitor terminals are made of tin or tin plated.

The present invention further provides a method of forming a multi-chip module (MCM) including the steps of providing a substrate, applying a flux to respective gold (Au) or gold plated capacitor pads and respective C4 pads on the substrate, placing a plurality of capacitors having tin or tin-plated terminals on the respective capacitor pads and a plurality of integrated circuit (IC) dice on the respective C4 pads, and performing a reflow operation on the capacitors, the IC dice and the substrate such that gold-tin (Au—Sn) intermetallic interconnects are formed between the substrate capacitor pads and the respective capacitor terminals. An underfill is dispensed into a plurality of gaps between the substrate and the respective IC dice. Finally, the capacitors and the IC dice are sealed with respective ones of a plurality of lids, thereby forming the multi-chip module.

Referring now to FIGS. 5A through 5F and FIG. 6, a method of forming a packaged semiconductor device in accordance with the present invention will now be described.

Figure 5A:
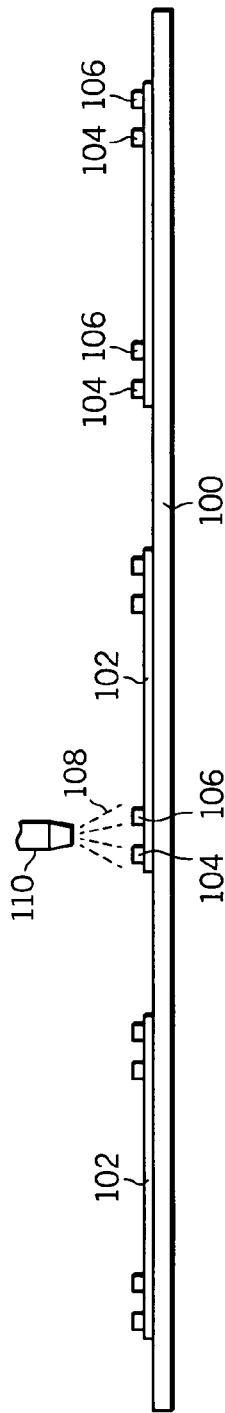
FIG. 5A is an enlarged cross-sectional view of a flux being applied to capacitor pads on a substrate in accordance with an embodiment of the present invention.
Figure 6:
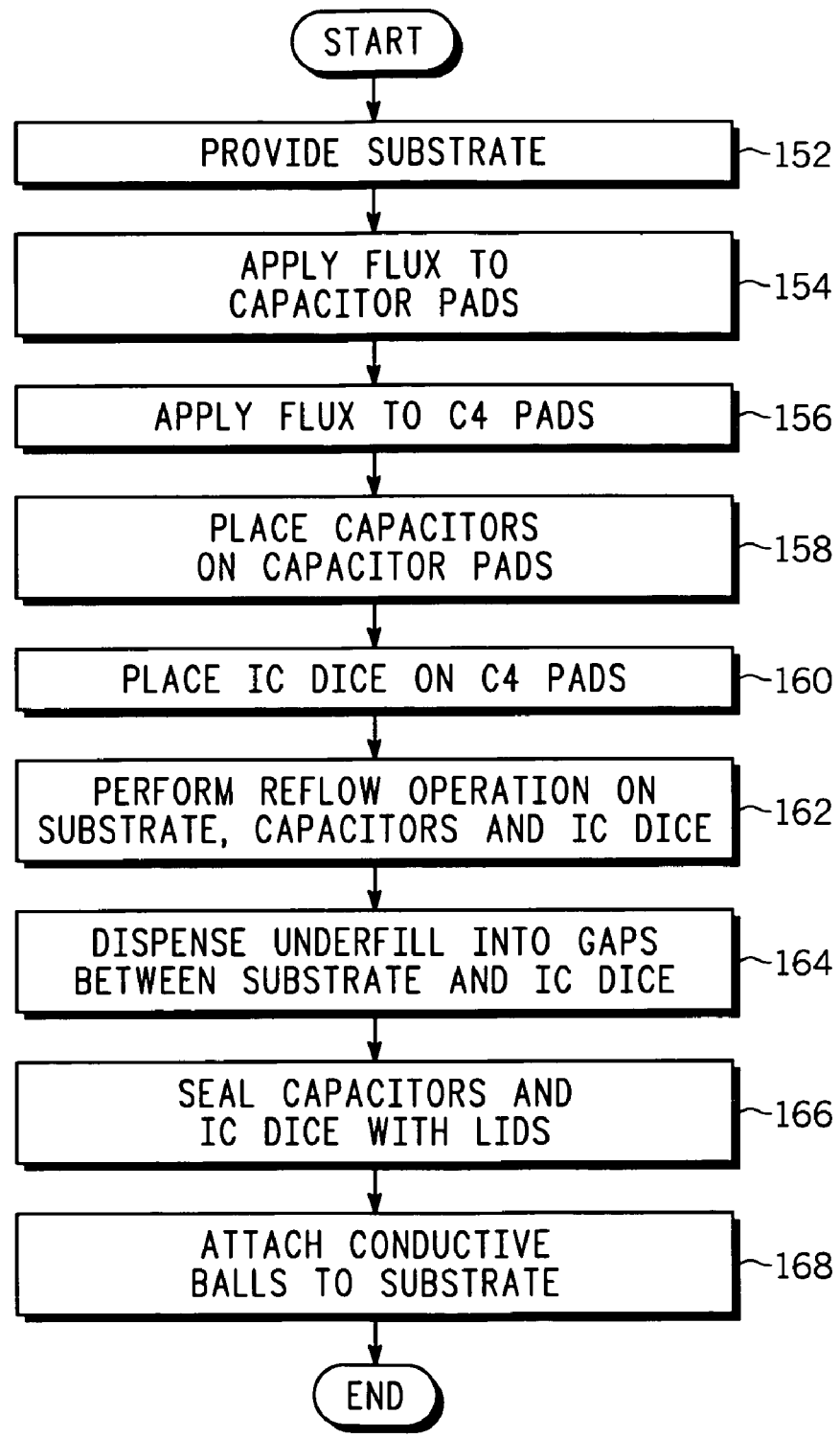
FIG. 6 is a flowchart depicting a method of forming a packaged semiconductor device in accordance with an embodiment of the present invention.

FIG. 5A shows a substrate 100 having a metallization layer 102 formed thereon. The metallization layer 102 includes one or more first and second capacitor pads 104 and 106 and a plurality of controlled collapse chip connection (C4) pads (not shown). The first and second capacitor pads 104 and 106 are plated with a metal. A flux 108 is applied to the first and second capacitor pads 104 and 106 on the substrate 100 via a nozzle 110. In FIG. 6, which is a flow chart of a process 150 for forming a packaged semiconductor device, step 152 indicates the provision of the substrate 100 and step 154 indicates applying the flux 108 to the respective capacitor pads 104 and 106 on the substrate 100.

The substrate 100 preferably is a ceramic substrate such as, for example, a Multilayer Ceramic (MLC). Such substrates are known in the art and commercially available. The metallization layer 102 is formed on the substrate 100 using known electroplating processes. The metallization layer 102 may comprise copper (Cu), tin (Sn), gold (Au), nickel (Ni), a tin-lead (Sn—Pb) solder or other suitable metals or alloys known to those of skill in the art. The first and second capacitor pads 104 and 106 preferably are plated with (Au). In one embodiment, the metallization layer 102 and the first and second capacitor pads are plated with Au to a thickness of about 0.1 microns (μm). Nonetheless, those of skill in the art will understand that the present invention is not limited to a particular type of substrate 100, by the metals or alloys used to form the metallization layer 102, by the thickness of the metallization layer 102, or the thickness of the first and second capacitor pads 104 and 106.

Although not shown in FIG. 5A, the flux 108 is also applied to the C4 pads on the substrate 100. The application of the flux 108 to the C4 pads is indicated at step 156 in FIG. 6. The flux 108 removes oxides from the first and second capacitor pads 104 and 106 and the C4 pads to facilitate the formation of intermetallic bonds thereon. The flux 108 preferably is a rosin type flux such as, for example, a rosin (R) flux or a rosin mildly activated (RMA) flux, per the IPC-J-STD-004 standard on Requirements for Soldering Fluxes. As can be seen from FIG. 5A, the flux 108 is applied to the first and second capacitor pads 104 and 106 by spraying in this particular embodiment. Nonetheless, those of skill in the art will understand that the present invention is not limited by the flux application method. For example, the flux 108 can also be applied to the first and second capacitor pads 104 and 106 and the C4 pads by dotting. Another alternative is to dip the capacitor into a flux reservoir and transferring the capacitor with the flux to the substrate, with the fluxed capacitor terminals contacting respective ones of the capacitor pads 104 and 106. The present invention differs from the prior art method (FIG. 1) in that solder paste is not applied to the capacitor pads 104 and 106.

Figure 5B:
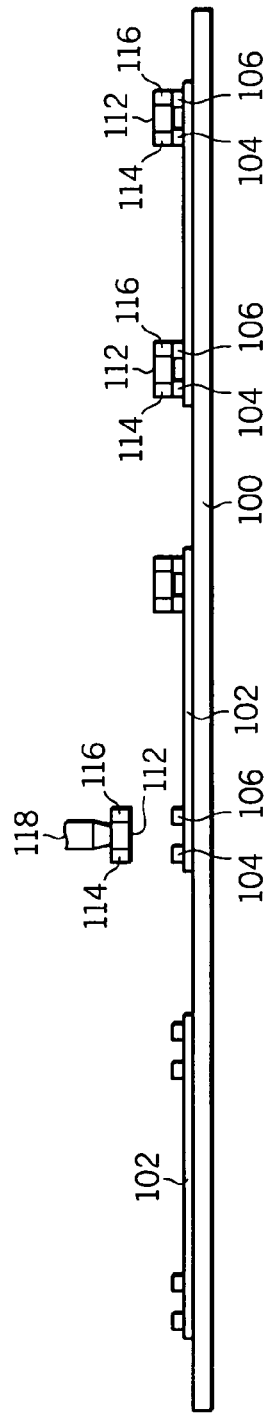
FIG. 5B is an enlarged cross-sectional view of a capacitor being placed on the fluxed capacitor pads of FIG. 5A.

Referring now to FIGS. 5B and 6, one or more capacitors 112 having respective first and second end terminations 114 and 116 are placed at step 158 on the respective first and second capacitor pads 104 and 106. More particularly, each capacitor 112 is placed across a pair of first and second capacitor pads 104 and 106 such that the first end termination 114 contacts the first capacitor pad 104 and the second end termination 116 contacts the second capacitor pad 106.

The capacitors 112 are on-chip capacitors such as, for example, Multilayer Ceramic Capacitors (MLCCs). Such capacitors 112 are known in the art and commercially available. The first and second end terminations 114 and 116 provide electrical terminals for respective conductive elements in the capacitor 112. The first and second end terminations 114 and 116 may be formed by dipping each end of the capacitor 112 into a thick film paste, such as, for example, silver (Ag) ink, then curing and plating the ends of the capacitor 112 with one or more of a metal and an alloy, for example, nickel (Ni) and tin (Sn). Accordingly, in one embodiment, the first and second end terminations 114 and 116 comprise nickel-plated silver, with a second plating of Sn. In another embodiment, the capacitor terminals 114, 116 are silver terminals with only tin plating. The capacitors 112 may be placed on the substrate 100 either manually or by automated means. In the embodiment shown in FIG. 5B, the capacitors 112 are placed on the substrate 100 using a placement head 118 of a standard pick-and-place machine. The capacitors 112 are held in place during the subsequent processing steps by the adhesive quality of the flux 108 applied to the first and second capacitor pads 104 and 106.

Figure 5C:
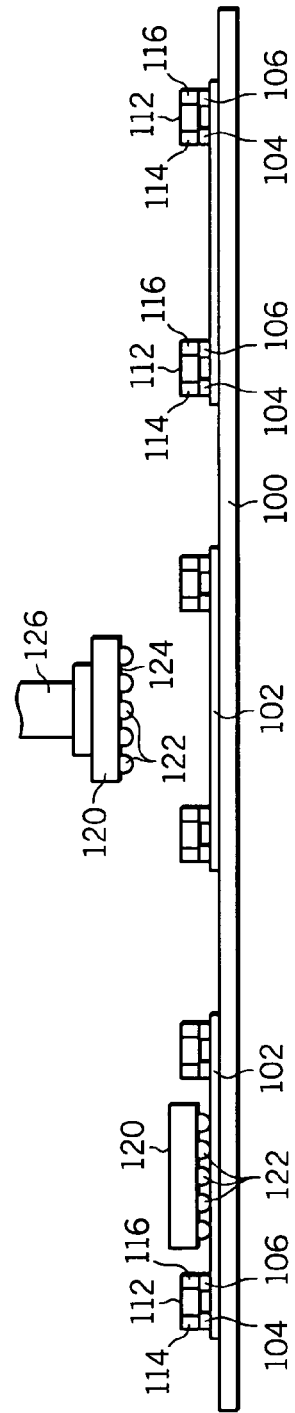
FIG. 5C is an enlarged cross-sectional view of an integrated circuit (IC) die being placed on the substrate of FIG. 5B.

Referring now to FIGS. 5C and 6, one or more integrated circuit (IC) dice 120 are placed at step 160 on the respective C4 pads. The IC dice 120 in the embodiment shown are flip chip dice with bump connections 122 on a bottom surface 124 thereof. The IC dice 120 are placed on the substrate 100 such that the bump connections 122 of the IC die 120 contact respective ones of the C4 pads on the substrate 100. The IC dice 120 may be placed on the substrate 100 by means of automatic pick-and-place or by manual placement. In the embodiment shown, the IC dice 120 are placed on the substrate 100 using a placement head 126 of a standard pick-and-place machine.

The IC dice 120 may be any type of circuit such as, for example, a digital signal processor (DSP) or a special function circuit. The IC dice 120 are not limited to a particular technology such as CMOS, or derived from any particular wafer technology. Further, the present invention can accommodate IC dice 120 of various sizes; for example, the IC dice 120 may be about 10 millimeters (mm) by about 10 mm in size. The bump connections 122 are made of a conductive metal such as gold, copper, or a metal alloy and are formed on the IC dice 120 using a known wafer bumping process. Such flip-chip bumped dice 120 are known by those of skill in the art and therefore, further explanation is not necessary for a complete understanding of the invention.

Figure 5D:
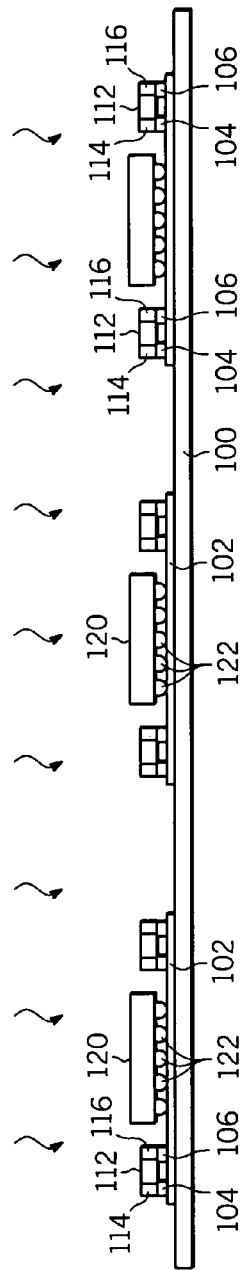
FIG. 5D is an enlarged cross-sectional view of a reflow operation being performed on the substrate, the capacitors and the IC dice of FIG. 5C.

Referring now to FIGS. 5D and 6, a reflow operation is performed at step 162 on the substrate 100, the capacitors 112 and the IC dice 120 by passing the substrate 100 through a reflow oven. The reflow oven preferably is conveyorized. The reflow operation may be performed using known methods of reflow attachment such as, for example, Infrared Radiation (IR) Reflow, Vapour Phase Reflow and Hot Air Convection Reflow. The substrate 100, the capacitors 112 and the IC dice 120 preferably are reflowed at a temperature of greater than about 300° C. In one embodiment, the substrate 100, the capacitors 112 and the IC dice 120 are reflowed at a temperature of about 360° C.

The heat in the reflow oven melts the first and second capacitor pads 104 and 106 and the bump connections 122. The melted first and second capacitor pads 104 and 106 wet the respective first and second end terminations 114 and 116 on the capacitors 112, while the melted bump connections 122 wet the C4 pads on the substrate 100.

Figure 5E:
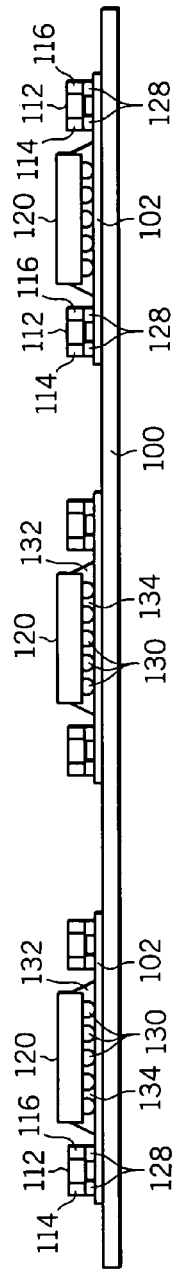
FIG. 5E is an enlarged cross-sectional view of an underfill dispensed into gaps between the substrate and respective ones of the IC dice of FIG. 5D.

Referring now to FIG. 5E, intermetallic interconnects 128 are formed between the substrate 100 and the respective capacitors 112, while controlled collapse chip connection (C4) interconnections 130 are formed between the substrate 100 and the respective IC dice 120 on cooling the substrate 100. The intermetallic interconnects 128 preferably are gold-tin (Au—Sn) intermetallic interconnects comprising about 20 weight percent (wt %) Au and about 80 wt % Sn. Referring now to FIG. 7, a phase diagram of a gold-tin (Au—Sn) system is shown. As can be seen from FIG. 7, a stable Au—Sn intermetallic having a composition of about 20 wt % Au and about 80 wt % Sn is formed at a temperature of between about 280° C. and about 300° C. Nevertheless, as will be understood by those of skill in the art, the process temperatures and compositions described above are merely exemplary. Those of skill in the art will understand that the present invention is not limited by the temperature of the reflow process, the composition of the intermetallic interconnects 128 or the temperature at which the intermetallic interconnects 128 are formed. Rather, the process temperatures and compositions are dependent on the types of metals or alloys with which the first and second capacitor pads 104 and 106 are formed and plated.

Referring again to FIG. 5E, an underfill 132 is dispensed into a plurality of gaps 134 between the substrate 100 and the respective IC dice 120. In FIG. 6, dispensing of the underfill 132 into the gaps 134 is indicated at step 164. The underfill 132 provides mechanical support for the C4 interconnections 130 by reducing the strain on the C4 interconnections 130 induced by coefficient of thermal expansion (CTE) mismatch between the substrate 100 and the IC dice 120. The underfill 132 may comprise well-known commercially available underfilling materials such as epoxy. In one embodiment, the IC dice 120 are under filled by using a needle to dispense the underfill material along the edges of the respective IC dice 120. In such embodiment, the underfill 132 is drawn inwards by capillary action until the gaps 134 between the substrate 100 and the respective IC dice 120 are filled. The underfill 132 subsequently is cured. Nonetheless, it should be understood that the present invention is not limited by the composition of the underfill 132 or to the underfilling process described above. In alternative embodiments, the IC dice 120 may be underfilled using other underfilling processes known to those of skill in the art.

Figure 5F:
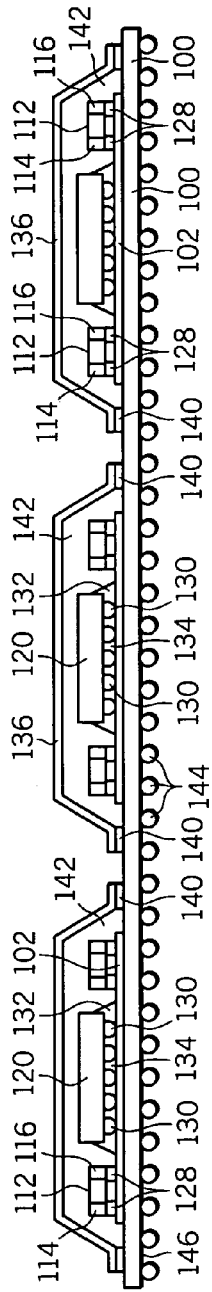
FIG. 5F is an enlarged cross-sectional view of a multi-chip module (MCM) formed in accordance with an embodiment of the present invention.

Referring now to FIGS. 5F and 6, the capacitors 112 and the IC dice 120 are sealed at step 166 with respective ones of a plurality of lids 136 or caps, which enhance the thermal path dissipation and provide protection to the capacitors and die from external abrasion. More particularly, each of the lids 136 is placed over one or more capacitors 112 and respective ones of the IC dice 120 and then attached to the substrate 100 with a lid attach material 140 to create a plurality of hermetic sealed multi-chip modules 138. The lids 136 may be made of ceramic or metal. The lid attach material 140 may be an epoxy or silicone in the case of ceramic lids 136, or a solder material when the lids 136 are made of metal. A plurality of conductive balls 144 may be attached at step 168 to an underside 146 of the substrate 100. The conductive balls 144 may be controlled collapse chip carrier connection (C5) solder balls and are attached to the substrate 100 using known solder ball attach processes.

Although FIGS. 5D to 5F show three (3) IC dice 120 being attached to the substrate 100, it will be understood that more or fewer IC dice 120 may be attached to the substrate 100, depending on the size of the substrate 100, the size of the IC dice 120, and the required functionality of the resulting semiconductor package device.

Unlike conventional capacitor attachment methods such as that described in FIG. 1, the present invention does not require the use of solder paste. Instead, the capacitor is placed directly onto fluxed capacitor pads of the substrate, and consequently intermetallic interconnects are formed between the capacitor and the substrate. By doing away with the use of solder paste, significant material, labour and machine cost savings are achieved, thereby reducing overall packaging cost. Additionally, the problems encountered when solder paste is used such as, for example, solder balling, tomb stoning and excess solder, are eradicated.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of attaching a capacitor to a substrate, consisting essentially of:
    applying a flux to respective capacitor pads on the substrate;
    placing the capacitor on the fluxed capacitor pads such that terminals of the capacitor contact respective ones of the fluxed capacitor pads; and
    performing a reflow operation on the capacitor and the substrate.

2. The method of attaching a capacitor to a substrate of claim 1, wherein the substrate capacitor pads are plated with gold (Au).

3. The method of attaching a capacitor to a substrate of claim 2, wherein the terminals of the capacitors are plated with tin (Sn).

4. The method of attaching a capacitor to a substrate of claim 3, wherein gold-tin (Au—Sn) intermetallic interconnects are formed between the capacitor terminals and the substrate capacitor pads.

5. The method of attaching a capacitor to a substrate of claim 4, wherein the Au—Sn intermetallic interconnects comprise about 20 weight percent (wt %) Au and about 80 wt % Sn.

6. The method of attaching a capacitor to a substrate of claim 5, wherein the Au—Sn intermetallic interconnects are formed at a temperature of between about 280° C. and about 300° C.

7. The method of attaching a capacitor to a substrate of claim 6, wherein the capacitor and the substrate are reflowed at a temperature of greater than about 300° C.

8. The method of attaching a capacitor to a substrate of claim 1, wherein the flux comprises one of rosin flux and rosin mildly activated flux.

9. The method of attaching a capacitor to a substrate of claim 1, wherein the flux is applied by one of spraying and dotting.

10. The method of attaching a capacitor to a substrate of claim 1, wherein the flux removes oxides from the capacitor pads on the substrate.

11. The method of attaching a capacitor to a substrate of claim 10, wherein the flux holds the capacitor in place.

12. A method of forming a packaged semiconductor device, consisting essentially of:
   providing a substrate;
   applying a flux to respective capacitor pads on the substrate;
   placing one or more capacitors on the respective capacitor pads, wherein terminals of the capacitors contact respective ones of the substrate capacitor pads;
   placing one or more integrated circuit (IC) dice on respective controlled collapse chip connection (C4) pads on the substrate; and
   performing a reflow operation on the one or more capacitors, the one or more IC dice and the substrate.

13. The method of forming a packaged semiconductor device of claim 12, wherein gold-tin (Au—Sn) intermetallic interconnects are formed between the substrate capacitor pads and the terminals of the respective one or more capacitors.

14. The method of forming a packaged semiconductor device of claim 12, further consisting essentially of applying the flux to the respective C4 pads on the substrate.

15. The method of forming a packaged semiconductor device of claim 12, further consisting essentially of dispensing an underfill into one or more gaps between the substrate and the respective one or more IC dice.

16. The method of forming a packaged semiconductor device of claim 15, further consisting essentially of sealing the one or more capacitors and the one or more IC dice.

17. The method of forming a packaged semiconductor device of claim 16, wherein the one or more IC dice and the one or more capacitors are sealed with respective ones of one or more lids.

18. The method of forming a packaged semiconductor device of claim 16, further consisting essentially of attaching a plurality of conductive balls to an underside of the substrate.

19. The method of forming a packaged semiconductor device of claim 12, wherein the substrate, the one or more capacitors and the one or more IC dice are reflowed at a temperature of greater than about 300° C.

20. A method of forming a multi-chip module, comprising the steps of:
   providing a substrate having gold-plated capacitor pads;
   applying a flux to respective capacitor pads and respective controlled collapse chip connection (C4) pads on the substrate;
   placing a plurality of capacitors on the respective fluxed capacitor pads, wherein the capacitors have tin-plated terminals;
   placing a plurality of integrated circuit (IC) dice on the respective fluxed C4 pads;
   performing a reflow operation on the substrate, the capacitors and the IC dice such that gold-tin (Au—Sn) intermetallic interconnects are formed between the substrate capacitor pads and the terminal ends of the respective capacitors;
   dispensing an underfill into a plurality of gaps between the substrate and the respective IC dice; and
   sealing the capacitors and the IC dice with respective ones of a plurality of lids, thereby forming the multi-chip module.

* * * * *